(12) United States Patent
Matsui

(10) Patent No.: US 6,347,057 B1
(45) Date of Patent: Feb. 12, 2002

(54) SEMICONDUCTOR MEMORY DEVICE WITH SENSE AMPLIFIER BLOCK

(75) Inventor: Katsuaki Matsui, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/461,285

(22) Filed: Dec. 15, 1999

(30) Foreign Application Priority Data

Apr. 15, 1999 (JP) ................................. 11-107737

(51) Int. Cl.[7] .................................................. G11C 7/00
(52) U.S. Cl. .............. 365/203; 365/189.11; 365/230.03
(58) Field of Search ........................... 365/203, 189.11, 365/189.01, 230.03, 230.01

(56) References Cited

U.S. PATENT DOCUMENTS

| 5,402,378 | A | | 3/1995 | Min et al. | |
|---|---|---|---|---|---|
| 5,623,446 | A | | 4/1997 | Hisada et al. | |
| 5,689,461 | A | | 11/1997 | Kaneko et al. | |
| 5,991,216 | A | * | 11/1999 | Raad et al. | ................. 365/203 |
| 6,023,437 | A | * | 2/2000 | Lee | .............................. 365/203 |
| 6,028,797 | A | | 2/2000 | Kim et al. | |
| 6,069,828 | A | * | 5/2000 | Kaneko et al. | ......... 365/189.09 |
| 6,097,623 | A | * | 8/2000 | Sakata | ........................ 365/145 |

FOREIGN PATENT DOCUMENTS

EP          0 717 415 A2    6/1996

* cited by examiner

Primary Examiner—Hoai V. Ho
(74) Attorney, Agent, or Firm—Rabin & Berdo, P.C.

(57) ABSTRACT

The semiconductor memory device according to the present invention includes a sense amplifier block sa, a pair of memory cell blocks mc0 and mc1, a pair of word driver blocks wd1-0 and wd1-1, a pair of decoder blocks dec1-0 and dec1-1 and a control circuit block cnt101. Inverters INV0 and INV1 provided at the control circuit block cnt101 respectively invert the potential levels of block selection signals BS0 and BS1, whereas level shifters LS0 and LS1 provided at the control circuit block cnt101 amplify the outputs from the inverters INV0 and INV1 respectively to generate equalize signals EQ0 and EQ1 whose potentials swing back and forth between a second source potential VPP and a ground potential VSS so that high speed access is realized even while energy efficiency and greater capacity are achieved.

5 Claims, 9 Drawing Sheets

SEMICONDUCTOR MEMORY DEVICE WITH SENSE AMPLIFIER BLOCK

BACKGROUND OF THE INVENTION

The present invention relates to a semiconductor memory device.

FIG. 9 illustrates the structure of the memory cell peripheral circuits in a semiconductor memory device in the prior art. This semiconductor memory device includes a sense amplifier block sa, a pair of memory cell blocks mc0 and mc1, a pair of word driver blocks wd1-0 and wd1-1, a pair of decoder blocks dec 1-0 and dec 1-1 and a control circuit block cnt1.

The sense amplifier block sa, to which equalize signals EQ, EQ0 and EQ1, a sense amplifier activating signal SE and transfer signals TG0 and TG1 are input, is connected to a bit line pair BL0/BL0b and a bit line pair BL1/BL1b. The potential levels of the equalize signals EQ, EQ0 and EQ1 and the potential level of the sense amplifier activating signal SE swing back and forth between a first source potential VDD and a ground potential VSS, whereas the potential levels of the transfer signals TG0 and TG1 swing back and forth between a second source potential VPP and the ground potential VSS.

The sense amplifier block sa is constituted of a sense amplifier unit amp and a sense amplifier control circuit unit acnt.

The sense amplifier unit amp is constituted of PMOS transistors P0 and P1 and NMOS transistors N0, N1, N00, N01, N02, N03, N04, N10, N11, N12, N13 and N14.

The gate of the PMOS transistor P0 is connected to a bit line BL, the drain is connected to a bit line BLb and the source is connected to a sense node SP. The gate of the PMOS transistor P1 is connected to the bit line BLb, the drain is connected to the bit line BL and the source is connected to the sense node SP. The gate of the NMOS transistor N0 is connected to the bit line BL, the drain is connected to the bit line BLb and the source is connected to a sense node SN. The gate of the NMOS transistor N1 is connected to the bit line BLb and the drain is connected to the bit line BL and the source is connected to the sense node SN.

On/off control of the NMOS transistor N00, whose drain is connected to the bit line BL0b and whose source is connected to the bit line BLb, is implemented by using the transfer signal TG0 input to the gate. On/off control of the NMOS transistor N01, whose drain is connected to the bit line BL0 and whose source is connected to the bit line BL is implemented by using the transfer signal TG0 input to the gate.

On/off control of the NMOS transistor N10, whose drain is connected to the bit line BL1b and whose source is connected to the bit line BLb is implemented by using the transfer signal TG1 input to the gate. On/off control of the NMOS transistor N11, whose drain is connected to the bit line BL1 and whose source is connected to the bit line BL is implemented by using the transfer signal TG1 input to the gate.

On/off control of the NMOS transistor N02, whose drain is connected to the bit line BL0b and whose source is connected to a third source potential VBL (=½ VDD) is implemented by using the equalize signal EQ0 input to the gate. On/off control of the NMOS transistor N03, whose drain is connected to the bit line BL0 and whose source is connected to the third source potential VBL is implemented by using the equalize signal EQ0 input to the gate. On/off control of the NMOS transistor N04, whose drain is connected to the bit line BL0b and whose source is connected to the bit line BL0 is implemented by using the equalize signal EQ0 input to the gate.

On/off control of the NMOS transistor N12, whose drain is connected to the bit line BL1b and whose source is connected to the source potential VBL is implemented by using the equalize signal EQ1 input to the gate. On/off control of the NMOS transistor N13, whose drain is connected to the bit line BL1 and whose source is connected to the third source potential VBL is implemented by using the equalize signal EQ1 input to the gate. On/off control of the NMOS transistor N14, whose drain is connected to the bit line BL1b and whose source is connected to the bit line BL1, is implemented by using the equalize signal EQ1 input to the gate.

In response to the sense amplifier activating signal SE, the sense amplifier control circuit unit acnt supplies the first source potential VDD to the sense node SP and supplies the ground potential VSS to the sense node SN. In addition, in response to the equalize signal EQ, it supplies the third sour VBL to the sense node SP and the sense node SN.

In the semiconductor memory device in the prior art illustrated in FIG. 9, the equalization (balancing of potentials) for the bit line pair BL0/BL0b and the bit line pair BL1/BL1b is achieved by supplying third source potential to the bit line pair BL0/BL0b and the bit line pair BL1/BL1b via the NMOS transistors N02, N03 and N04 and the NMOS transistors N12, N13 and N14 respectively.

However, since the gate potentials (=potentials of the equalize signals EQ0 and EQ1) at the NMOS transistors N02, N03, N04, N12, N13 and N14 during such an equalization operation are at the first source potential VDD, the voltage Vgs between the gates and the sources is at ½ VDD.

When operating the semiconductor memory device in the prior art with the first source potential VDD set at 1.0V~2.0V in order to, for instance, save energy, the voltage Vgs between the gates and the sources at the NMOS transistors N02, N03, N04, N12, N13 and N14 is set within the range of 0.5V~1.0V, which raises the concern that a sufficient margin relative to the threshold voltage Vt may not be assured. In such a case, limits are set on the currents flowing through the individual NMOS transistors N02, N03, N04, N12, N13 and N14, which makes it difficult to equalize the bit line pairs BL0/BL0b and BL1/BL1b quickly.

Likewise, when equalizing the bit line pair BL/BLb via the NMOS transistors N00, N01, N10 and N11, too, there is a concern that the length of time required for the equalization may be large since the gate potentials (=potentials of the transfer signals TG0 and TG1) of the individual NMOS transistors N00, N01, N10 and N11 during the equalization operation are set at the first source potential VDD.

In addition, while FIG. 9 illustrates a semiconductor memory device in the prior art provided with a single sense amplifier block sa, a semiconductor memory device is normally provided with a plurality of sense amplifier blocks and consequently, a plurality of memory cell blocks and a plurality of word driver blocks in correspondence. Furthermore, each sense amplifier block is provided with a great number of sense amplifiers. When the number of sense amplifiers increases in this manner, parasitic capacitance and parasitic resistance in the lines through which the equalize signals EQ0 and EQ1 are provided increase, which results in a delay occurring when the potential levels of the equalize signals EQ0 and EQ1 shift.

In the semiconductor memory device in the prior art illustrated in FIG. 9, when reading out data stored in a cell capacitor C00, for instance, it is necessary to shift the potential at a word line WL00 to the second source potential VPP after the potential of the equalize signal EQ0 shifts to the ground potential VSS and the bit line pair BL0/BL0*b* are completely cut off from the third source potential VBL to ensure that a read error does not occur due to the electrical charge discharged from the cell capacitor C00 discharged to the third source potential VBL via the NMOS transistors N02 and N03. However, the delay occurring in the shift of the potential levels of the equalize signals EQ0 and EQ1 described above necessitates a delay in the timing with which the potential level at the word line shifts and, consequently, the access speed of the semiconductor memory device is lowered.

SUMMARY OF THE INVENTION

An object of the present invention, which has been completed by addressing the problems discussed above, is to provide a semiconductor memory device which is capable of high speed access even when energy efficiency and larger capacity are achieved.

In order to achieve the object described above, the present invention provides a semiconductor memory device comprising one or more memory elements that store information, a bit line pair through which information read out from a memory element is transmitted, a means for amplification that amplifies the potentials at one bit line and the other bit line constituting the bit line pair to a reference potential and a first source potential respectively and a means for equalization that is controlled by an equalize signal achieving a second source potential which is higher than the first source potential and equalizes the potentials at the bit line pair to a third source potential.

By assuring a sufficient difference between the second source potential and the first source potential, it is possible to equalize the bit line pair quickly and with a high degree of reliability even when the first source potential is set at a low level in order to, for instance, achieve energy efficiency and the like.

In addition, it is desirable to provide the means for equalization with a first potential supply transistor that supplies the third source potential to one bit line, a second potential supply transistor that supplies the third source potential to the other bit line and a connector transistor that connects the one bit line to the other bit line, and to input the equalize signal to the gates of the first potential supply transistor, the second potential supply transistor and the connector transistor.

When each transistor is constituted of, for instance, an NMOS transistor by setting the second source potential equal to or greater than the sum of the threshold voltage at these transistors and the first source potential, the gate voltage for turning on the individual transistors can be set equal to or greater than the threshold voltage with a high degree of reliability. Consequently, the ON resistance at the individual transistors that is controlled by the equalize signal can be kept at a low level.

Alternatively, one bit line may be connected to the means for amplification via a first amplification means connector transistor with the other bit line connected to the means for amplification via a second amplification means connector transistor. In this case, the first amplification means connector transistor and the second amplification means connector transistor are controlled with an amplification means connector transistor control signal achieving the second source potential.

When each transistor is constituted of, for instance, an NMOS transistor by setting the second source potential equal to or greater than the sum of the threshold voltage at these transistors and the first source potential, the gate voltage for tuning on the individual transistors can be set equal to or greater than the threshold voltage with a high degree of reliability. Consequently, the ON resistance at the individual transistor that is controlled by the amplification means connector transistor control signal can be kept at a low level when amplifying the potentials at the bit line pair.

In addition, according to the present invention, a semiconductor memory device comprising a first memory element group constituted of one or more memory elements that store information, a second memory element group constituted of one or more memory elements that store information, a first bit line pair through which information read out from one or more memory elements in the first memory element group is transmitted, a second bit line pair through which information read out from one or more memory elements in the second memory element group is transmitted, a means for amplification that amplifies the potentials at one bit line and the other bit line constituting the first bit line pair to a reference potential and a first source potential respectively and amplifies the potentials at one bit line and the other bit line constituting the second bit line pair to the reference potential and the first source potential respectively, a first means for equalization that is controlled by a first control signal achieving a second source potential higher than the first source potential and equalizes the first bit line pair to a third source potential and a second means for equalization that is controlled by a second control signal achieving the second source potential and equalizes the second bit line pair to the third source potential.

By assuring a sufficient difference between the second source potential and the first source potential, equalization of the first bit line pair and the second bit line pair can be achieved quickly and with a high degree of reliability even when the first source potential is set at a low level to achieve, for instance, energy efficiency and the like.

The semiconductor memory device may assume a structure in which one bit line in the first bit line pair is connected to the means for amplification via a first amplification means connector transistor, the other bit line in the first bit line pair is connected to the means for amplification via a second amplification means connector transistor, one bit line in the second bit line pair is connected to the means for amplification via a third amplification means connector transistor and the other bit line in the second bit line pair is connected to the means for amplification via a fourth amplification means connector transistor. In this case, the first amplification means connector transistor and the second amplification means connector transistor are controlled by a second control signal and the third amplification means connector transistor and the fourth amplification means connector transistor are controlled by a first control signal.

When each transistor is constituted of, for instance, an NMOS transistor in this structure, by setting the second source potential equal to or greater than the sum of the threshold voltage and the first source potential at the transistors, the gate voltage for turning on the individual transistors can be set equal to or greater than the threshold voltage with a high degree of reliability. Thus, it becomes possible to keep the ON resistance at the first amplification means connector transistor and the second amplification means connector transistor that are controlled by the second control signal when amplifying the potentials at the first bit line pair at a low level, and to keep the ON resistance at the third amplification means connector transistor and the fourth amplification means connector transistor that are controlled by the first control signal when amplifying the potentials at the second bit line pair at a low level.

Furthermore, the first means for equalization and the third and fourth amplification means connector transistors are commonly controlled by the first control signal and the second means for equalization and the first and second amplification means connector transistors are commonly controlled by the second control signal, to achieve simplification of the circuit in the semiconductor memory device.

It is desirable to provide a plurality of first word lines connected to the individual memory elements in the first memory element group, a first means for word line drive that selectively drives one of the plurality of first word lines in correspondence to the potential level of the first control signal, a plurality of second word lines connected to the individual memory elements in the second memory element group and a second means for word line drive that selectively drives one of the plurality of second word lines in correspondence to the potential level of the second control signal.

By adopting this structure, it becomes possible to set the timing with which the first word line is driven in synchronization with the shift of the potential level of the first control signal. It also becomes possible to set the timing with which the second word line is driven in synchronization with the shift of the potential of the second control signal.

It is desirable to provide the first means for word line drive with a plurality of first word line drive units that individually drive the plurality of first word lines and a first selection unit that selects one of the plurality of first word line drive units in correspondence to the potential level of the first control signal and the potential level of an address signal. In addition, it is desirable to provide the second means for word line drive with a plurality of second word line drive units that individually drive the plurality of second word lines and a second selection unit that selects one of the plurality of second word line drive units in correspondence to the potential level of the second control signal and the potential level of the address signal.

In this structure, the first selection unit provided at the first means for word line drive and the second selection unit provided at the second means for word line drive are controlled by the common address signal. As a result, further simplification of the circuit structure in the semiconductor memory device is achieved.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of the preferred embodiments of the semiconductor memory device according to the present invention, given in reference to the attached drawings. It is to be noted that in the following explanation and the attached drawings, the same reference numbers are assigned to components having practically identical functions and structural features to preclude the necessity for repeating an explanation thereof.

(First Embodiment)

Figure 1:
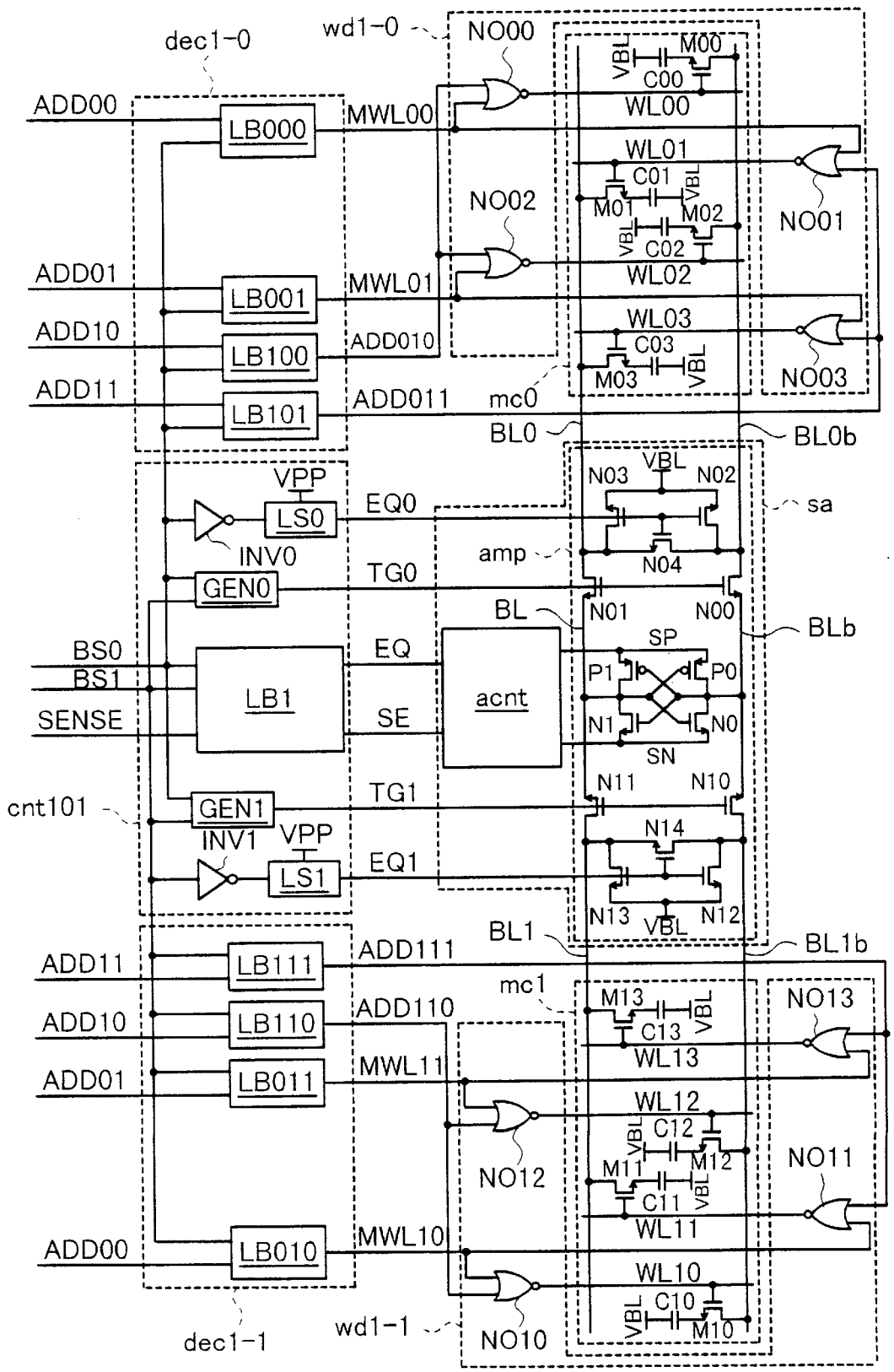
FIG. 1 is a circuit diagram showing the structures of the memory cell peripheral circuits in the semiconductor memory device in a first embodiment of the present invention.

FIG. 1 illustrates the structures of the memory cell peripheral circuits in the semiconductor memory device in the first embodiment of the present invention. This semiconductor memory device includes a sense amplifier block sa, a pair of memory cell blocks mc0 and mc1 respectively constituting a first memory element group and a second memory element group, a pair of word driver blocks wd1-0 and wd1-1, a pair of decoder blocks dec1-0 and dec1-1 and a control circuit block cnt101.

The sense amplifier block sa, to which equalize signals EQ, EQ0 and EQ1, a sense amplifier activating signal SE and transfer signals TG0 and TG1 are input, is connected to a bit line pair BL0/BL0b constituting a first bit line pair and a bit line pair BL1/BL1b constituting a second bit line pair. The potential level of the sense amplifier activating signal SE swings back and forth between a first source potential VDD and a ground potential VSS that is set as a reference potential, whereas the potential levels of the equalize signals EQ, EQ0 and EQ1 and transfer signals TG0 and TG1 swing back and forth between a second source potential VPP and the ground potential VSS.

The sense amplifier block sa is constituted of a sense amplifier unit amp and a sense amplifier control circuit unit acnt.

The sense amplifier unit amp comprises PMOS transistors P0 and P1 and NMOS transistors N0 and N1 constituting a means for amplification, NMOS transistors N00, N01, N10 and N11 respectively constituting a first amplification means connector transistor, a second amplification means connector transistor, a third amplification means connector transistor and a fourth amplification means connector transistor, NMOS transistors N02, N03 and N04 constituting a first means for equalization and NMOS transistors N12, N13 and N14 constituting a second means for equalization.

The gate of the PMOS transistor P0 is connected to a bit line BL, the drain is connected to a bit line BLb and the source is connected to a sense node SP. The gate of the PMOS transistor P1 is connected to the bit line BLb, the drain is connected to the bit line BL and the source is connected to the sense node SP. The gate of the NMOS transistor N0 is connected to the bit line BL, the drain is connected to the bit line BLb and the source is connected to a sense node SN. The gate of the NMOS transistor N1 is connected to the bit line BLb and the drain is connected to the bit line BL and the source is connected to the sense node SN.

On/off control of the NMOS transistor N00, whose drain is connected to the bit line BL0b and whose source is connected to the bit line BLb is implemented by using the transfer signal TG0 input to the gate. On/off control of the NMOS transistor N01, whose drain is connected to the bit line BL0 and whose source is connected to the bit line BL is implemented by using the transfer signal TG0 input to the gate.

On/off control of the NMOS transistor N10, whose drain is connected to the bit line BL1b and whose source is connected to the bit line BLb is implemented by using the transfer signal TG1 input to the gate. On/off control of the NMOS transistor N11, whose drain is connected to the bit line BL1 and whose source is connected to the bit line BL is implemented by using the transfer signal TG1 input to the gate.

On/off control of the NMOS transistor N02, whose drain is connected to the bit line BL0b and whose source is connected to a third source potential VBL is implemented by using the equalize signal EQ0 input to the gate. On/off control of the NMOS transistor N03, whose drain is connected to the bit line BL0 and whose source is connected to the third source potential VBL is implemented by using the equalize signal EQ0 input to the gate. On/off control of the NMOS transistor N04, whose drain is connected to the bit line BL0b and whose source is connected to the bit line BL0 is implemented by using the equalize signal EQ0 input to the gate.

On/off control of the NMOS transistor N12, whose drain is connected to the bit line BL1b and whose source is connected to the third source potential VBL,is implemented by using the equalize signal EQ1 input to the gate. On/off control of the NMOS transistor N13, whose drain is connected to the bit line BL1 and whose source is connected to the third source potential VBL is implemented by using the equalize signal EQ1 input to the gate. On/off control of the NMOS transistor N14, whose drain is connected to the bit line BL1b and whose source is connected to the bit line BL1, is implemented by using the equalize signal EQ1 input to the gate.

In response to the sense amplifier activating signal SE, the sense amplifier control circuit unit acnt supplies the first source potential VDD to the sense node SP and supplies the ground potential VSS to the sense node SN. In addition, in response to the equalize signal EQ, it supplies the third source potential VBL to the sense node SP and the sense node SN.

The pair of memory cell blocks mc0 and mc1 is provided for the sense amplifier block sa. It is to be noted that since the memory cell blocks mc0 and mc1 have structures practically identical to each other, the explanation is given below on the memory cell block mc0 as an example.

The memory cell block mc0 is connected to word lines WL00, WL01, WL02 and WL03 and the bit lines BL0 and BL0b. The potential levels at the word lines WL00, WL01, WL02 and WL03 swing back and forth between the second source potential VPP and the ground potential VSS.

The memory cell block mc0 is constituted of the NMOS transistors M00, M01, M02 and M03 and cell capacitors C00, C01, C02 and C03 constituting memory elements.

The gate of the NMOS transistor M00 is connected to the word line WL00, the drain is connected to the bit line BL0b and the source is connected to one end of the cell capacitor C00. The gate of the NMOS transistor M01 is connected to the word line WL01, the drain is connected to the bit line BL0 and the source is connected to one end of the cell capacitor C01. The gate of the NMOS transistor M02 is connected to the word line WL02, the drain is connected to the bit line BL0b and the source is connected to one end of the cell capacitor C02. The gate of the NMOS transistor M03 is connected to the word line WL03, the drain is connected to the bit line BL0 and the source is connected to one end of the cell capacitor C03. The other ends of the cell capacitors C00, C01, C02 and C03 are all connected to the third source potential VBL.

The pair of word driver blocks wd1-0 and wd1-1 are respectively provided in correspondence to the memory cell blocks mc0 and mc1. It is to be noted that since the word driver blocks wd1-0 and wd1-1 have structures that are practically identical to each other, the explanation is given below on the word driver block wd1-0 as an example.

The word driver block wd1-0 is connected to main word lines MWL00 and MWL11 and the word lines WL00, WL01, WL02 and WL03. In addition, address signals ADD010 and ADD011 are input to the word driver block wd1-0. The potential levels of the main word lines MWL00 and MWL01 and the potential levels of the address signals ADD010 and ADD011 swing back and forth between the second source potential VPP and the ground potential VSS.

The word driver block wd1-0 is constituted of NOR gates NO00, NO01, NO02 and NO03.

The main word line MWL00 is connected to one input end of the NOR gate NO00 and to one input end of the NOR gate NO01, whereas the main word line MWL01 is connected to one input end of the NOR gate NO02 and to one input end of the NOR gate NO03. The address signal ADD010 is input to another input end of the NOR gate NO00 and to another input end of the NOR gate NO02, and the address signal ADD011 is input to another input end of the NOR gate NO01 and to another input end of the NOR gate NO03. An output end of the NOR gate NO00 is connected to the word line WL00, an output end of the NOR gate NO01 is connected to the word line WL01, an output end of the NOR gate NO02 is connected to the word line WL02, and an output end of the NOR gate NO03 is connected to the word line WL03.

The pair of decoder blocks dec1-0 and dec1-1 are respectively provided corresponding to the word driver blocks wd1-0 and wd1-1. It is to be noted that since the decoder blocks dec1-0 and dec1-1 have structures that are practically identical to each other, an explanation is given below on the decoder block dec1-0 as an example.

The decoder block dec1-0 is connected to the main word lines MWL00 and MWL01. In addition, the decoder block dec1-0 is structured so that address signals ADD00, ADD01, ADD10 and ADD11 and a block selection signal BS0 are input and the address signals ADD010 and ADD011 are output. The potential levels of the address signals ADD00, ADD01, ADD10 and ADD11 and the potential level of the block selection signal BS0 swing back and forth between the first source potential VDD and the ground potential VSS.

The decoder block dec1-0 comprises a logic operation unit LB000 that outputs the results of a logic operation performed using the address signal ADD00 and the block selection signal BS0 to the main word line MWL00, a logic operation unit LB001 that outputs the results of a logic operation performed using the address signal ADD01 and the block selection signal BS0 to the main word line MWL01, a logic operation unit LB100 that outputs the results of a logic operation performed using the address signal ADD10 and the block selection signal BS0 as the address signal ADD010 and a logic operation unit LB101 that outputs the results of a logic operation performed using the address signal ADD11 and the block selection signal BS0 as the address signal ADD011.

Block selection signals BS0 and BS1 and a sense amplifier activating signal SENSE are input to the control circuit block cnt101 which, in turn, outputs the equalize signals EQ, EQ0 and EQ1, the sense amplifier activating signal SE and the transfer signals TG0 and TG1. The potential level of the sense amplifier activating signal SENSE swings back and forth between the first source potential VDD and the ground potential VSS.

In addition, the control circuit block cnt101 comprises a logic operation unit LB1, inverters INV0 and INV1, level shifters LS0 and LS1 and transfer signal generating circuits GEN0 and GEN1. The block selection signals BS0 and BS1 and the sense amplifier activating signal SENSE are input to the logic operation unit LB1 which, in turn, outputs the equalize signal EQ and the sense amplifier activating signal SE. The inverter INV0 is employed to invert the potential level of the block selection signal BS0, whereas the inverter INV1 is employed to invert the potential level of the block selection signal BS1. The level shifter LS0 generates the equalize signal EQ0 whose potential swings back and forth between the second source potential VPP and the ground potential VSS by amplifying the output from the inverter INV0, whereas the level shifter LS1 generates the equalize signal EQ1 whose potential swings back and forth between the second source potential VPP and the ground potential VSS by amplifying the output from the inverter INV1.

Figure 2:
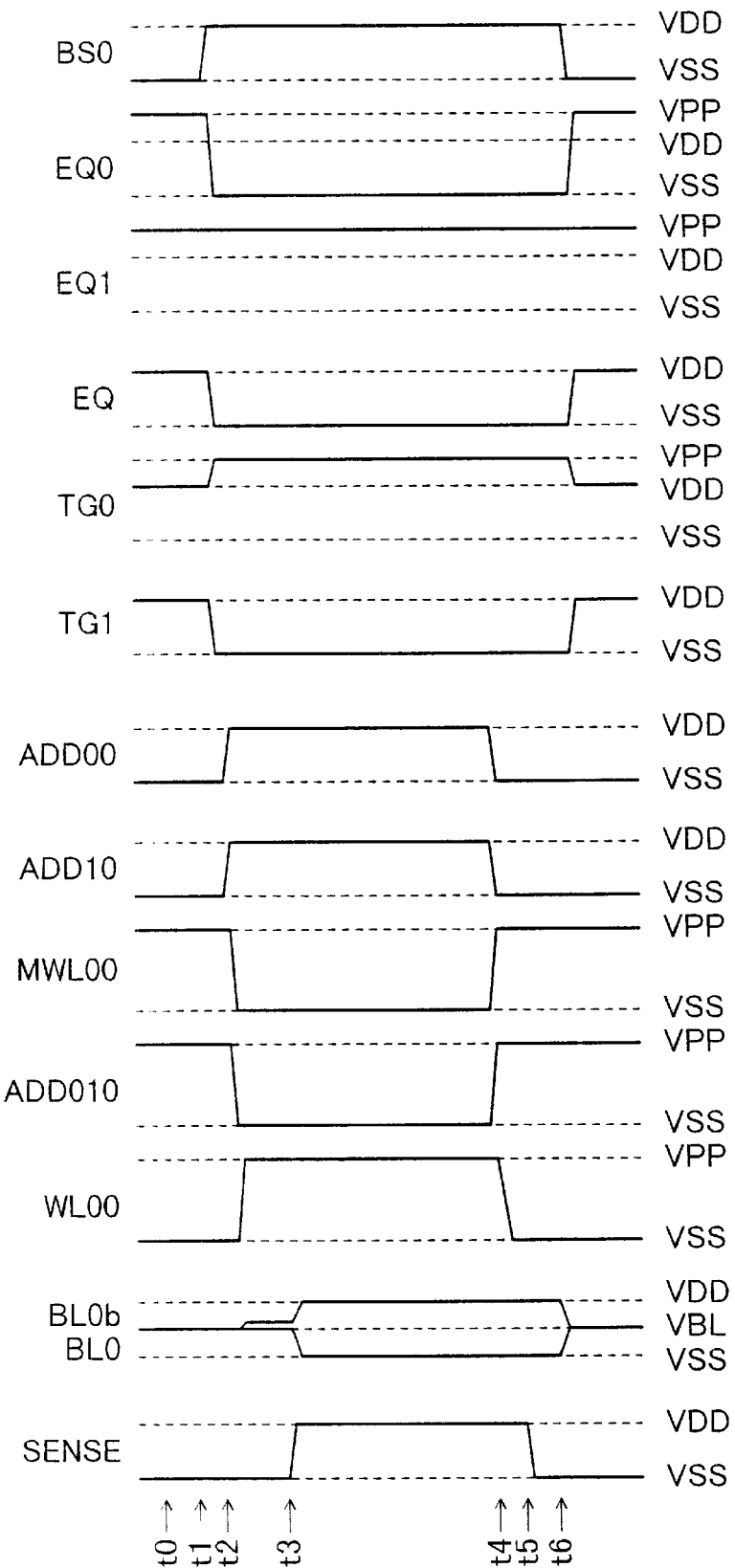
FIG. 2 is a time chart of the operations performed by the semiconductor memory device in FIG. 1.

Now, a data read operation and an equalize operations performed in the semiconductor memory device in the first embodiment of the present invention structured as described above are explained in reference to FIG. 2. It is to be noted that the explanation is given here on a case in which "1" information stored in the cell capacitor C00 (the cell capacitor C00 is charged to achieve the first potential VDD) is read out.

At a time point t0 (initial state), the potentials of the inputs at the semiconductor memory device, i.e., the potentials of the address signals ADD00, ADD01, ADD10 and ADD11, the potentials of the block selection signals BS0 and BS1 and the potential of the sense amplifier activating signal SENSE, are all at the ground potential VSS. Consequently, the equalize signal EQ and the transfer signals TG0 and TG1 are set at the first source potential VDD, the sense amplifier activating signal SE is set at the ground potential VSS and the equalize signals EQ0 and EQ1 are set at the second source potential VPP. In addition, the main word lines MWL00, MWL01, MWL10 and MWL11 and the address signals ADD010, ADD011, ADD110 and ADD111 are set at the second source potential VPP. The word lines WL00, WL01, WL02 and WL03 connected to the memory cell block mc0 and the word lines WL10, WL11, WL12 and WL13 connected to the memory cell block mc1 are set at the ground potential VSS, whereas the bit line pairs BL/BLb, BL0/BL0b and BL1/BL1b are set at the third source potential VBL.

At a time point t1, the potential of the block selection signal BS0 shifts to the first source potential VDD, which causes the potential of the transfer signal TG0 to shift to the second source potential VPP and the potential of the transfer signal TG1 to shift to the ground potential VSS. Then, the shift of the potential of the transfer signal TG1 to the ground potential VSS cuts off the bit line pair BL/BLb from the bit line pair BL1/BL1b that have been connected to each other via the NMOS transistors N10 and N11. In addition, the potentials of the equalize signals EQ and EQ0 shift to the ground potential VSS to cut off the bit line pair BL0/BL0b and the bit line pair BL/BLb from the third source potential VBL.

At a time point t2, the potentials of the address signal ADD00 and the address signal ADD10 shift to the first source potential VDD, and the potentials of the main word line MWL00 and the address signal ADD010 shift to the ground potential VSS. This causes the potential at the word line WL00 to shift to the second source potential VPP. As a result, the electrical charge stored at the cell capacitor C00 is discharged to the bit line BL0b via the NMOS transistor M00. Consequently, the potentials at the bit line BL0b and the bit line BLb rise, creating a slight difference in the potential relative to the bit line BL0 and the bit line BL that still hold the third source potential VBL.

At a time point t3, the potential of the sense amplifier activating signal SENSE shifts to the first source potential VDD. In response, the logic operation unit LB1 provided at the control circuit block cnt101 sets the sense amplifier activating signal SE to the ground potential VSS, and the sense amplifier control circuit unit acnt provided at the sense amplifier block sa biases the sense node SN to the ground potential VSS and biases the sense note SP to the first source potential VDD. Then, with the sense node SN and the sense node SP respectively biased to the ground potential VSS and the first source potential VDD, the NMOS transistors N0 and N1 and the PMOS transistors P0 and P1 provided at the sense amplifier unit amp in the sense amplifier block sa start operation to amplify the slight difference between the potentials at the bit line BLb and the bit line BL. In other words, the bit line BLb is biased to the first source potential VDD and the bit line BL is biased to the ground potential VSS.

Through the operation described above, the electrical charge stored at the cell capacitor C00 is read out at the bit line pair BL/BLb. Then, with the potential at the bit line BLb (the first source potential VDD) transmitted to the cell capacitor C00 via the NMOS transistor M00, the electrical charge at the cell capacitor C00 ("1" information) discharged at the time point t2 is compensated. It is to be noted that in order to compensate the electrical charge at the cell capacitor C00 (charged to achieve the first source potential VDD), it is necessary to set the second source potential VPP higher than, at least, VDD+Vt (the threshold voltage of the NMOS transistor M00).

Starting at a time point t4, an equalize operation is executed. The potentials of the address signals ADD00 and ADD10 shift to the ground potential VSS. Then, the potentials of the main word line MWL00 and the address signal ADD010 shift to the second source potential VPP and the potential at the word line WL00 shifts to the ground potential VSS. This turns of the NMOS transistor M00 and cuts off the cell capacitor C00 from the bit line BL0b.

A time point t5, the potential of the sense amplifier activating signal SENSE shifts to the ground potential VSS, and the sense nodes SN and SP and the bit line pair BL/BLb are cut off from the ground potential VSS and the first source potential VDD.

At a time point t6, the potential of the block selection signal BS0 shifts to the ground potential VSS. This causes the potentials of the transfer signals TG0 and TG1 to shift to the first source potential VDD so that the bit line pair BL0/BL0b, the bit line pair BL/BLb and the bit line pair BL1/BL1b become connected via the NMOS transistors N00, N01, N10 and N11.

In addition, the potential of the equalize signal EQ0 shifts to the second source potential VPP to turn on the NMOS transistors N02, N03, N04, N12, N13 and N14. As a result, the bit line BL0 and the bit line BL0b become connected to each other and the bit line BL1 and the bit line BL1b become connected to each other, which, in turn, results in the bit line pair BL0/BL0b and the bit line pair BL1/BL1b becoming equalized at the third source potential VBL.

Furthermore, since the potential of the equalize signal EQ shifts to the first source potential VDD, the sense nodes SN and SP are equalized at the third source potential VBL by the sense amplifier control circuit unit acnt provided at the sense amplifier block sa.

Moreover, the bit line pair BL/BLb, which are connected to the bit lines BL0 and BL0b and the bit lines BL1 and BL1b via the NMOS transistors N00, N01, N10 and N11, are equalized at the third source potential VBL.

The equalize operation ends at a point in time at which the potentials at the bit lines BL, BLb, BL0, BL0b, BL1 and BL1b are all set equal to the third source potential VBL with no difference in the potential left among them.

As explained above, in the semiconductor memory device in the first embodiment, the gate potentials at the NMOS transistors N02, N03, N12 and N13 (=the potentials of the equalize signals EQ0 and EQ1) are biased to the second source potential VPP during the equalize operation. Since the second source potential VPP is set higher than, at least, VDD+Vt as explained earlier, the voltage Vgs between the gates and the source at the NMOS transistors N02, N03, N12 and N13 at the time point t6 satisfy Vgs≧½ VDD+Vt. In other words, even when the first source potential VDD is set at a low level to achieve energy efficiency, the voltage Vgs between the gates and the sources at the NMOS transistors N02, N03, N12 and N13 is always higher than the threshold voltage Vt at the NMOS transistors by ½ VDD or more. Consequently, no restrictions are imposed upon the electrical current flowing through the NMOS transistors N02, N03, N12 and N13 so that the equalize operation on the bit lines BL0, BL0b, BL1 and BL1b can be completed within a short period of time.

(Second Embodiment)

Figure 3:
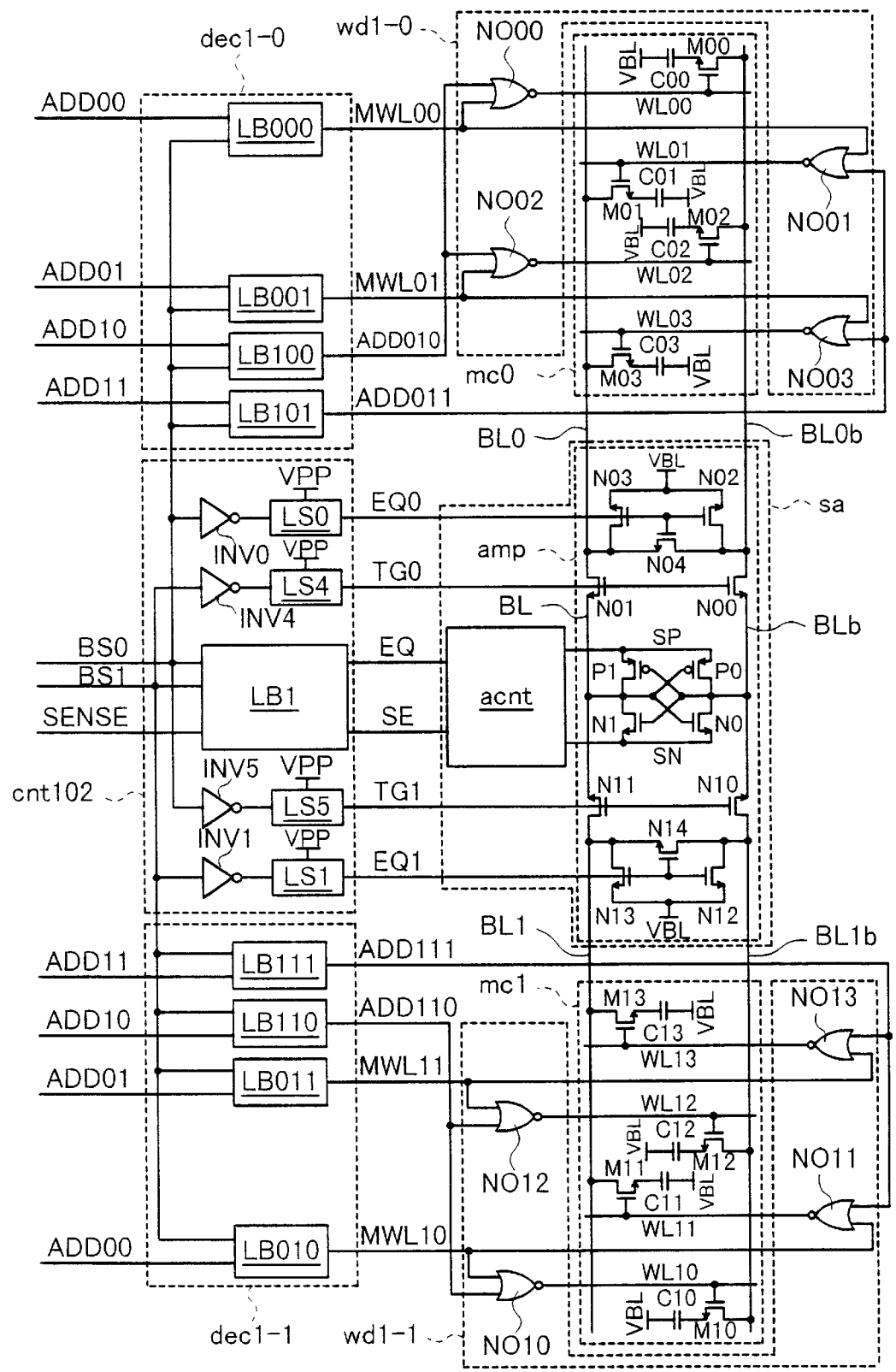
FIG. 3 is a circuit diagram showing the structures of the memory cell peripheral circuits in the semiconductor memory device in a second embodiment of the present invention.

FIG. 3 illustrates the structures of the memory cell peripheral circuits in the semiconductor memory device in the second embodiment of the present invention. This semiconductor memory device includes a sense amplifier block sa, a pair of memory cell blocks mc0 and mc1, a pair of word driver blocks wd1-0 and wd1-1, a pair of decoder blocks dec1-0 and dec1-1 and a control circuit block cnt102. In other words, the semiconductor memory device in the second embodiment adopts a structure achieved by replacing the control circuit block cnt101 in the semiconductor memory device in the first embodiment with the control circuit block cnt102.

Block selection signals BS0 and BS1 and a sense amplifier activating signal SENSE are input to the control circuit block cnt102 which, in turn, outputs equalize signals EQ, EQ0 and EQ1, a sense amplifier activating signal SE and transfer signals TG0 and TG1.

In addition, the control circuit block cnt102 comprises a logic operation unit LB1, inverters INV0, INV1, INV4 and INV5 and level shifters LS0, LS1, LS4 and LS5.

The block selection signals BS0 and BS1 and the sense amplifier activating signal SENSE are input to the logic operation unit LB1 which, in turn, outputs the equalize signal EQ and the sense amplifier activating signal SE.

The inverters INV0 and INV5 are employed to invert the potential level of the block selection signal BS0, whereas the inverters INV1 and INV4 are employed to invert the potential level of the block selection signal BS1. The level shifter LS0 generates the equalize signal EQ0 whose potential swings back and forth between the second source potential VPP and the ground potential VSS by amplifying the output from the inverter INV0, whereas the level shifter LS1 generates the equalize signal EQ1 whose potential swings back and forth between the second source potential VPP and the ground potential VSS by amplifying the output from the inverter INV1. The level shifter LS4 is provided to generate the transfer signal TG0 whose potential swings back and forth between the second source potential VPP and the ground potential VSS by amplifying the output from the inverter INV4 and the level shifter LS5 is provided to generate the transfer signal TG1 whose potential swings back and forth between the second source potential VPP and the ground potential VSS by amplifying the output from the inverter INV5.

Figure 4:
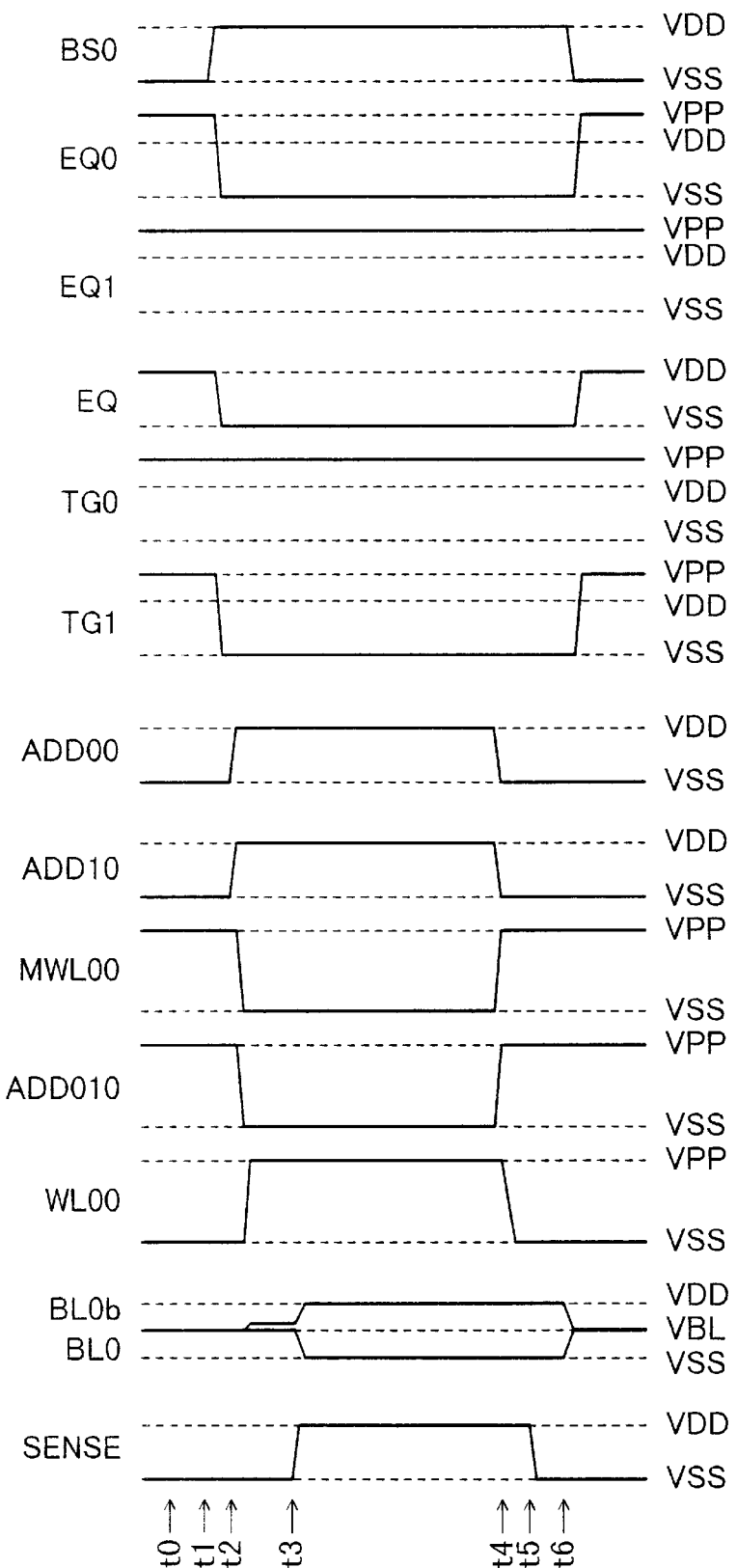
FIG. 4 is a time chart of the operations performed by the semiconductor memory device in FIG. 3.

Now, a data read operation and an equalize operations performed in the semiconductor memory device in the second embodiment of the present invention structured as described above are explained in reference to FIG. 4. It is to be noted that the explanation is given here on a case in which "1" information stored in the cell capacitor C00 (the cell capacitor C00 is charged to achieve the first potential VDD) is read out.

At a time point t0 (initial state), the potentials of the inputs at the semiconductor memory device, i.e., the potentials of the address signals ADD00, ADD01, ADD10 and ADD11, the potentials of the block selection signals BS0 and BS1 and the potential of the sense amplifier activating signal SENSE, are all at the ground potential VSS. Consequently, the equalize signal EQ is set at the first source potential VDD, the sense amplifier activating signal SE is set at the ground potential VSS and the equalize signals EQ0 and EQ1 and transfer signals TG0 and TG1 are set at the second source potential VPP. In addition, the main word lines MWL00, MWL01, MWL10 and MWL11 and the address signals ADD010, ADD011, ADD110 and ADD111 are set at the second source potential VPP. The word lines WL00, WL01, WL02 and WL03 connected to the memory cell block mc0 and the word lines WL10, WL11, WL12 and WL13 connected to the memory cell block mc1 are set at the ground potential VSS, whereas the bit line pairs BL/BLb, BL0/BL0b and BL1/BL1b are set at the third source potential VBL.

At a time point t1, the potential of the block selection signal BS0 shifts to the first source potential VDD, which causes the potential of the transfer signal TG1 to shift to the ground potential VSS. Then, the shift of the potential of the transfer signal TG1 to the ground potential VSS cuts off the bit line pair BL/BLb from the bit line pair BL1/BL1b that have been connected to each other via the NMOS transistors N10 and N11. In addition, the potentials of the equalize signals EQ and EQ0 shift to the ground potential VSS to cut off the bit line pair BL0/BL0b and the bit line pair BL/BLb from the third source potential VBL.

At a time point t2, the potentials of the address signal ADD00 and the address signal ADD10 shift to the first source potential VDD, and the potentials of the main word line MWL00 and the address signal ADD010 shift to the ground potential VSS. Thus, the potential at the word line WL00 shifts to the second source potential VPP. This causes the electrical charge stored at the cell capacitor C00 to be discharged to the bit line BL0b via the NMOS transistor M00. As a result, the potentials at the bit line BL0b and the bit line BLb rise, creating a slight difference in the potential relative to the bit line BL0 and the bit line BL that still hold the third source potential VBL.

At a time point t3, the potential of the sense amplifier activating signal SENSE shifts to the first source potential VDD. In response, the logic operation unit LB1 provided at the control circuit block cnt102 sets the sense amplifier activating signal SE to the ground potential VSS, and the sense amplifier control circuit unit acnt provided at the sense amplifier block sa biases the sense node SN to the ground potential VSS and biases the sense note SP to the first source potential VDD. Then, with the sense node SN and the sense node SP respectively biased to the ground potential VSS and the first source potential VDD, the NMOS transistors N0 and N1 and the PMOS transistors P0 and P1 provided at the sense amplifier unit amp in the sense amplifier block sa start operation to amplify the slight difference between the potentials at the bit line BLb and the bit line BL. In other words, the bit line BLb is biased to the first source potential VDD and the bit line BL is biased to the ground potential VSS.

Through the operation described above, the electrical charge stored at the cell capacitor C00 is read out at the bit line pair BL/BLb. Then, with the potential at the bit line BLb (the first source potential VDD) transmitted to the cell capacitor C00 via the NMOS transistor M00, the electrical charge at the cell capacitor C00 ("1" information) discharged at the time point t2 is compensated. It is to be noted that in order to compensate the electrical charge at the cell capacitor C00 (charged to achieve the first source potential VDD), it is necessary to set the second source potential VPP higher than, at least, VDD+Vt (the threshold voltage of the NMOS transistor M00).

Starting at a time point t4, an equalize operation is executed. The potentials of the address signals ADD00 and ADD10 shift to the ground potential VSS. Then, the potentials of the main word line MWL00 and the address signal ADD010 shift to the second source potential VPP and the potential at the word line WL00 shifts to the ground potential VSS. This turns off the NMOS transistor M00 and cuts off the cell capacitor C00 from the bit line BL0b.

A time point t5, the potential of the sense amplifier activating signal SENSE shifts to the ground potential VSS, and the sense node SN and SP and the bit line pair BL/BLb are cut off from the ground potential VSS and the first source potential VDD.

At a time point t6, the potential of the block selection signal BS0 shifts to the ground potential VSS. This causes the potential of the transfer signal TG1 to shift to the second source potential VPP so that the bit line pair BL0/BL0b, the bit line pair BL/BLb and the bit line pair BL1/BL1b become connected via the NMOS transistors N00, N01, N10 and N11.

In addition, the potential of the equalize signal EQ0 shifts to the second source potential VPP to turn on the NMOS transistors N02, N03, N04, N12, N13 and N14. As a result, the bit line BL0 and the bit line BL0b become connected to each other and the bit line BL1 and the bit line BL1b become connected to each other, which, in turn, results in the bit line pair BL0/BL0b and the bit line pair BL1/BL1b becoming equalized at the third source potential VBL.

Furthermore, since the potential of the equalize signal EQ shifts to the first source potential VDD, the sense nodes SN and SP are equalized at the third source potential VBL by the sense amplifier control circuit unit acnt provided at the sense amplifier block sa.

Moreover, the bit line pair BL/BLb, which is connected to the bit lines BL0 and BL0b and the bit lines BL1 and BL1b via the NMOS transistors N00, N01, N10 and N111 are equalized at the third source potential VBL.

The equalize operation ends at a point in time at which the potentials at the bit lines BL, BLb, BL0, BL0b, BL1 and BL1b are all set equal to the third source potential VBL with no difference in the potential left among them.

As explained above, in the semiconductor memory device in the second embodiment, the gate potentials at the NMOS transistors N00, N01, N10 and N11 (=the potentials of the transfer signals TG0 and TG1) are biased to the second source potential VPP during the equalize operation. Since the second source potential VPP is set higher than, at least, VDD+Vt as explained earlier, the voltage Vgs between the gates and the source at the NMOS transistors N00, N01, N10 and N11 at the time point t6 satisfy Vgs≧½ VDD+Vt. In other words, even when the first source potential VDD is set at a low level to achieve energy efficiency, the voltage Vgs between the gates and the sources at the NMOS transistors N00, N01, N10 and N11 is always higher than the threshold voltage Vt at the NMOS transistors by ½ VDD or more. Consequently, no restrictions are imposed upon the electrical current flowing through the NMOS transistors N00, N01, N10 and N11 so that the equalize operation on the bit lines BL0, BL0b, BL1 and BL1b can be completed within a shorter period of time compared to the length of time required by the semiconductor memory device in the first embodiment.

(Third Embodiment)

Figure 5:
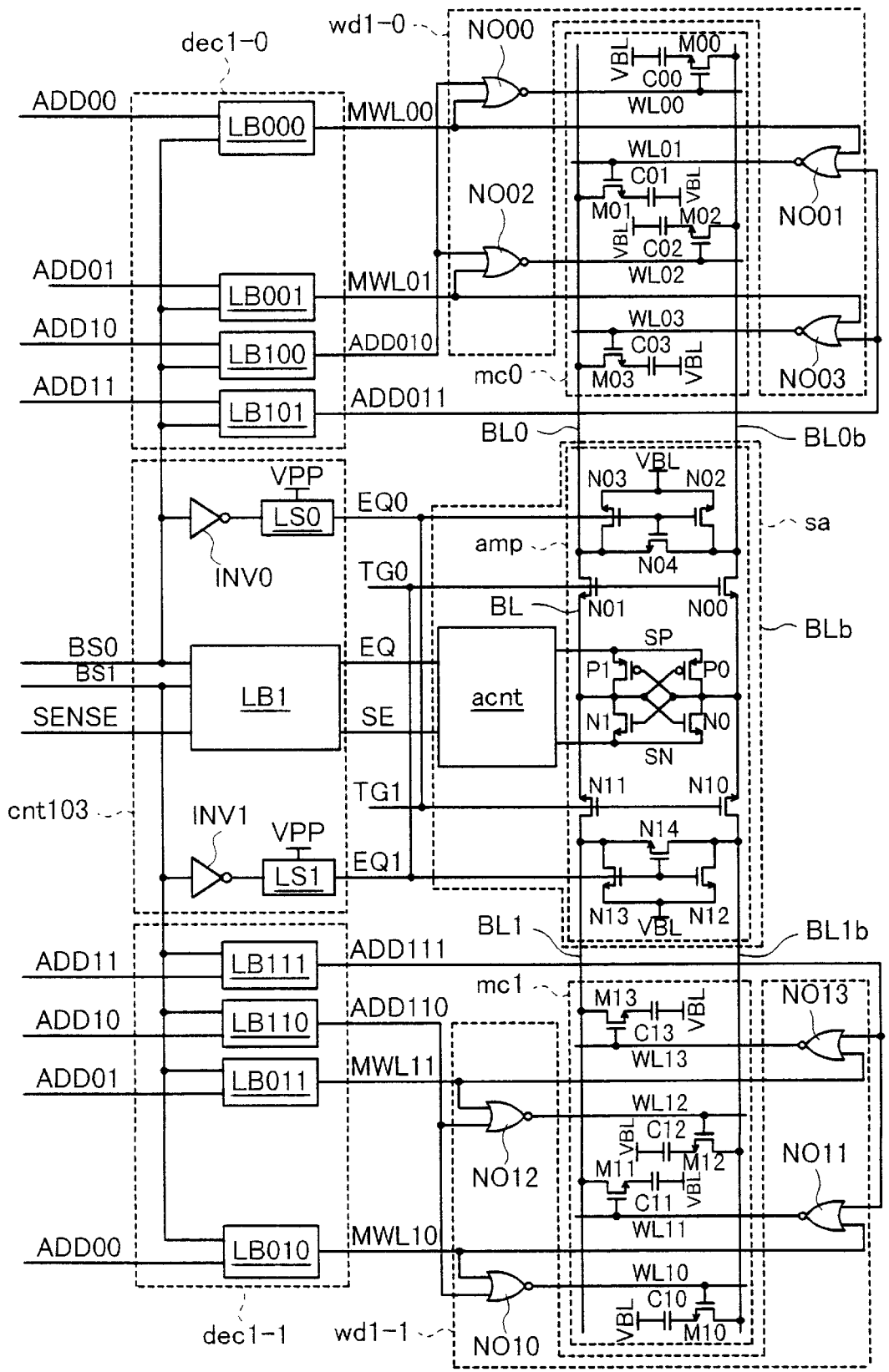
FIG. 5 is a circuit diagram showing the structures of the memory cell peripheral circuits in the semiconductor memory device in a third embodiment of the present invention.

FIG. 5 illustrates the structures of the memory cell peripheral circuits in the semiconductor memory device in the third embodiment of the present invention. This semiconductor memory device includes a sense amplifier block sa, a pair of memory cell blocks mc0 and mc1, a pair of word driver blocks wd1-0 and wd1-1, a pair of decoder blocks dec1-0 and dec1-1 and a control circuit block cnt103. In other words, the semiconductor memory device in the third embodiment adopts a structure achieved by replacing the control circuit block cnt102 in the semiconductor memory device in the second embodiment with the control circuit block cnt103.

The control circuit block cnt103 comprises a logic operation unit LB1, inverters INV0 and INV1 and level shifters LS0, and LS1. Block selection signals BS0 and BS1 and a sense amplifier activating signal SENSE are input to the logic operation unit LB1 which, in turn, outputs the equalize signal EQ and sense amplifier activating signal SE. The inverter INV0 is employed to invert the potential level of the block selection signal BS0, whereas the inverter INV1 is employed to invert the potential level of the block selection signal BS1. The level shifter LS0 generates an equalize signal EQ0 and the transfer signal TG1 whose potentials swing back and forth between the second source potential VPP and the ground potential VSS by amplifying the output from the inverter INV0, whereas the level shifter LS1 generates an equalize signal EQ1 and a transfer signal TG0 whose potentials swing back and forth between the second source potential VPP and the ground potential VSS by amplifying the output from the inverter INV1. The control circuit block cnt103 assumes a structure achieved by eliminating the inverters INV 4 and INV 5 and the level shifters LS4 and LS5 from the control circuit block cnt 102.

The level shifter LS0 outputs an output signal to the individual gates of the NMOS transistors N02, N03 and N04 provided at the sense amplifier block sa as the equalize signal EQ0 and outputs an output signal to the NMOS transistors N10 and N11 provided at the sense amplifier block sa as the transfer signal TG1. In addition, the level shifter LS1 outputs an output signal to the individual gates of the NMOS transistors N12, N13 and N14 provided at the sense amplifier block sa as the equalize signal EQ1 and outputs an output signal to the NMOS transistors N00 and N01 provided at the sense amplifier block sa as the transfer signal TG0.

As explained above, in the semiconductor memory device in the third embodiment, the inverters INV4 and INV5 and the level shifters LS4 and LS5 are omitted and at the same time, the equalize signal EQ0 and the transfer signal TG1 are integrated and the equalize signal EQ1 and the transfer signal TG0 are integrated, to achieve simplification in the circuit structure compared to that in the semiconductor memory device in the second embodiment. Thus, a reduction in the layout area of the semiconductor memory device is achieved.

(Fourth Embodiment)

Figure 6:
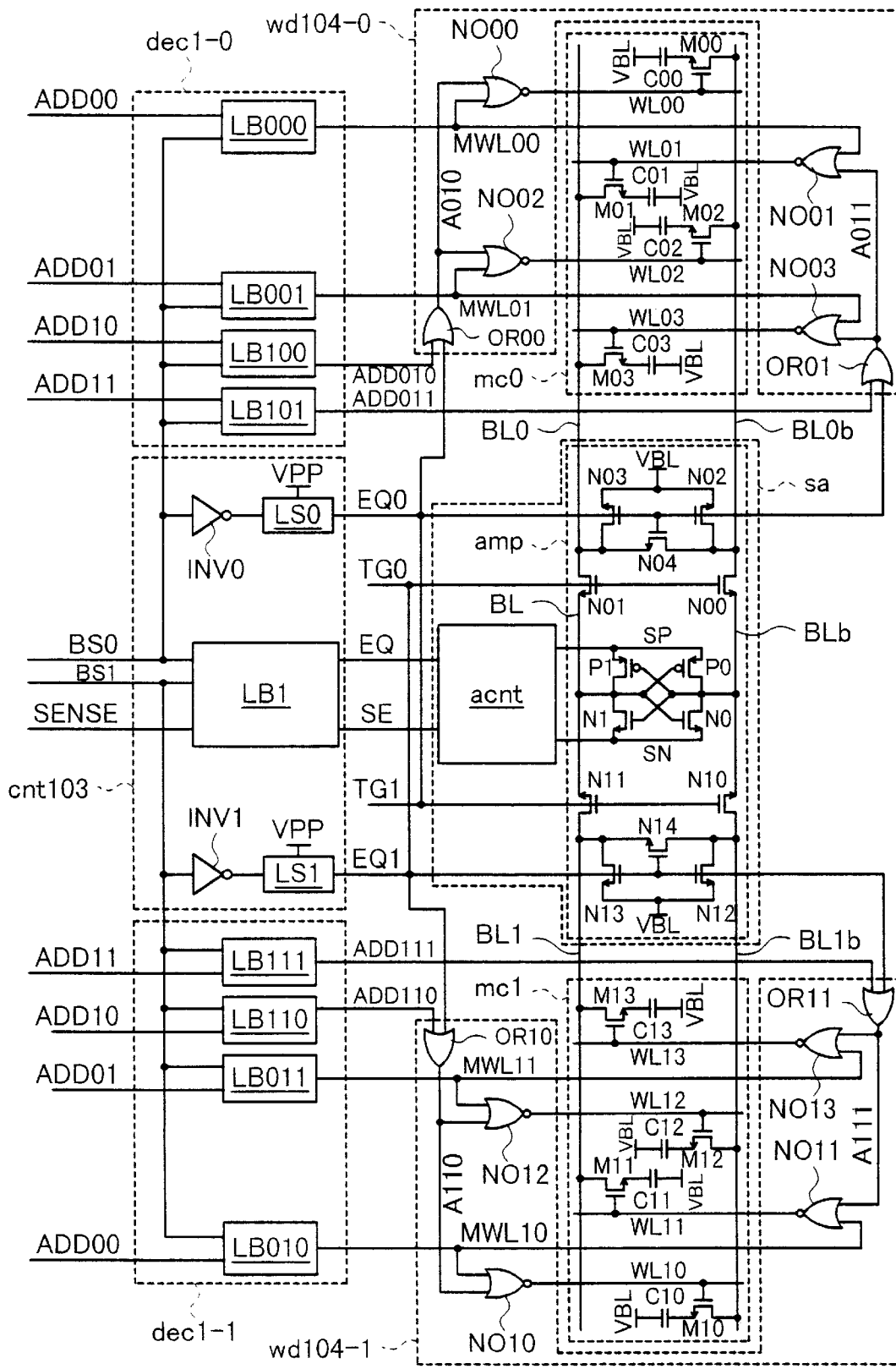
FIG. 6 is a circuit diagram showing the structures of the memory cell peripheral circuits in the semiconductor memory device in a fourth embodiment of the present invention.

FIG. 6 illustrates the structure of the memory cell peripheral circuits in the semiconductor memory device in the fourth embodiment of the present invention. This semiconductor memory device includes a sense amplifier block sa, a pair of memory cell blocks mc0 and mc1, a pair of word driver blocks wd104-0 and wd104-1 respectively constituting a first means for word line drives and a second means for word line drive, a pair of decoder blocks dec1-0 and dec1-1 and a control circuit block cnt103. In other words, the semiconductor memory device in the fourth embodiment adopts a structure achieved by replacing the pair of word driver blocks wd1-0 and wd1-1 in the semiconductor memory device in the third embodiment with the pair of word driver blocks wd104-0 and wd104-1.

The pair of word driver blocks wd104-0 and wd104-1 are respectively provided in correspondence to the memory cell blocks mc0 and mc1. It is to be noted that since the word driver blocks wd104-0 and wd104-1 have structures that are practically identical to each other, in the following explanation, the word driver block wd104-0 is described in detail as an example.

The main word lines MWL00 and MWL11 and the address signals ADD010 and ADD011 and the equalize signal EQ0 are input to the word driver block wd104-0, which, in turn, outputs the word lines WL00, WL01, WL02 and WL03.

In addition, the word driver block wd104-0 comprises OR gates OR00 and OR01 constituting a first selection unit and NOR gates NO00, NO01, NO02 and NO03 constituting a first word line drive unit.

The OR gate OR00, to one input end of which the address signal ADD010 is input and to another input end of which the equalize signal EQ0 (=transfer signal TG1) is input as a first control signal, outputs an address signal A010. The OR gate OR01, to one input end of which the address signal ADD011 is input and to another input end of which the equalize signal EQ0 (=transfer signal TG1) is input, outputs an address signal A011. The main word line MWL00 is connected to one input end of the NOR gate NO00 and to one input end of the NOR gate NO01 and the main word line MWL01 is connected to one input end of the NOR gate NO02 and to one input end of the NOR gate NO03. The address signal A010 output by the OR gate OR00 is input to another input end of the NOR gate NO00 and another input end of the NOR gate NO02, and the address signal A011 output by the OR gate OR01 is input to another input end of the NOR gate NO01 and another input end of the NOR gate NO03. The word line WL00 is connected to an output end of the NOR gate NO00, the word line WL01 is connected to an output end of the NOR gate NO01, the word line WL02 is connected to an output end of the NOR gate NO02 and word line WL03 is connected to an output end of the NOR gate NO03.

Figure 7:
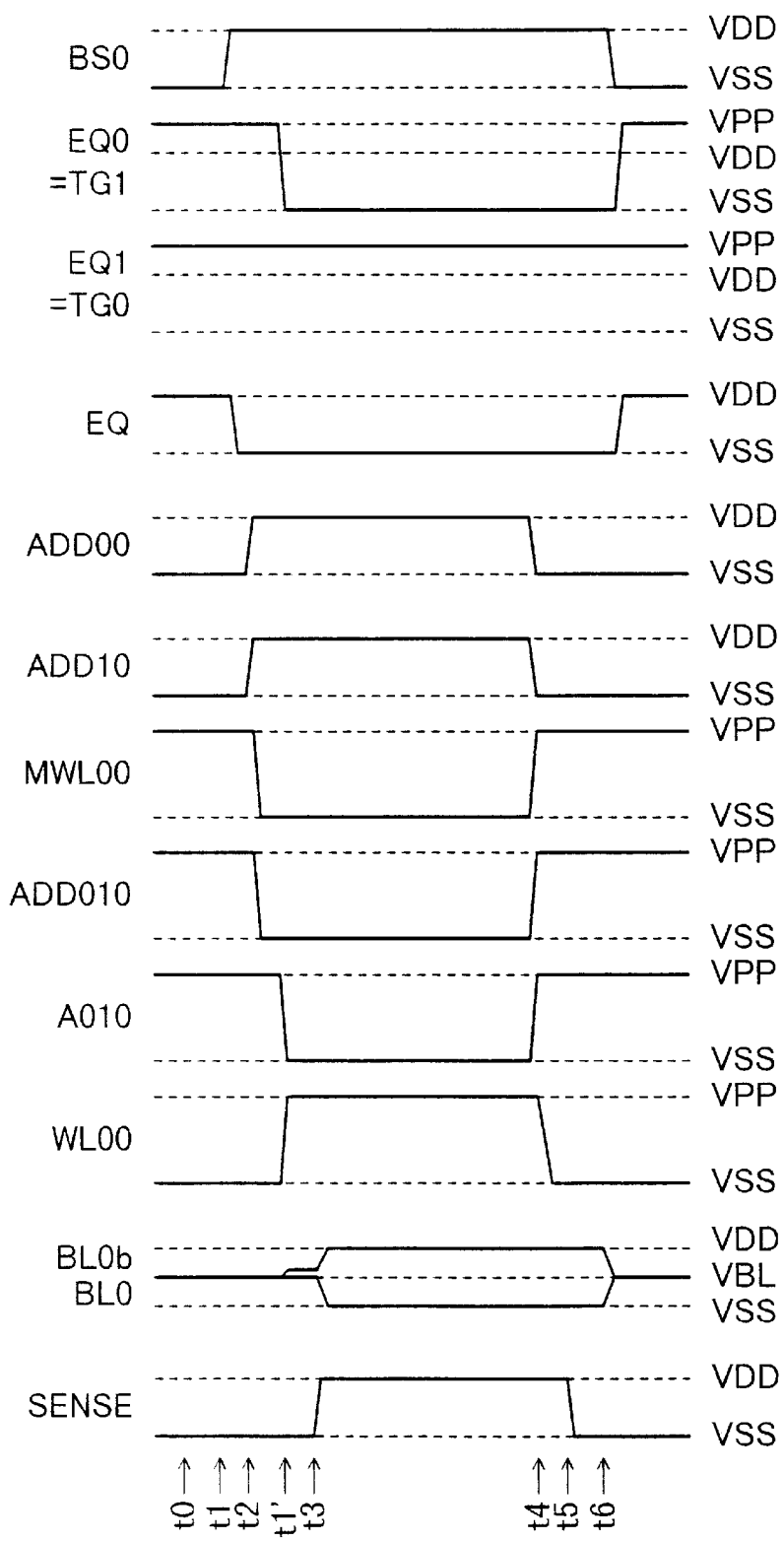
FIG. 7 is a time chart of the operations performed by the semiconductor memory device in FIG. 6.

Now, a data read operation and an equalize operations performed in the semiconductor memory device in the fourth embodiment of the present invention structured as described above are explained in reference to FIG. 7. It is to be noted that the explanation is given here on a case in which "1" information stored in the cell capacitor C00 (the cell capacitor C00 is charged to achieve the first potential VDD) is read out.

At a time point t0 (initial state), the potentials of the inputs at the semiconductor memory device, i.e., the potentials of the address signals ADD00, ADD01, ADD10 and ADD11, the potentials of the block selection signals BS0 and BS1 and the potential of the sense amplifier activating signal SENSE, are all at the ground potential VSS. Thus, the equalize signal EQ is set at the first source potential VDD, the sense amplifier activating signal SE is set at the ground potential VSS, and the equalize signal EQ0 (=transfer signal TG1) and the equalize signal EQ1 (=transfer signal TG0) used as a second control signal are set at the second source potential VPP. In addition, the main word lines MWL00, MWL01, MWL10 and MWL11 and the address signals ADD010, ADD011, ADD110 and ADD111 are set at the second source potential VPP. The word lines WL00, WL01, WL02 and WL03 connected to the memory cell block mc0 and the word lines WL10, WL11, WL12 and WL13 connected to the memory cell block mc1 are set at the ground potential VSS, whereas the bit line pairs BL/BLb, BL0/BL0b and BL1/BL1b are set at the third source potential VBL.

At a time point t1, the potential of the block selection signal BS0 shifts to the first source potential VDD and the potential of the equalize signal EQ shifts to the ground potential VSS. This cuts off the bit line pair BL/BLb from the third source potential VBL.

Now, at the time point t1 at which the potential of the block selection signal BS0 shifts to the first source potential VDD, the potential of the transfer signal TG1 (=equalize signal EQ0) would shift to the ground potential VSS in the prior art. However, if a plurality of sense amplifier blocks are provided and, consequently, a plurality of memory cell blocks and a plurality of word driver blocks are provided in correspondence in the semiconductor memory device illustrated in FIG. 6, the parasitic capacitance and the parasitic resistance in the lines through which the equalize signals EQ0 and EQ1 and the transfer signals TG0 and TG1 are provided may increase, presenting a concern that a delay may occur in the shift of potential levels of the equalize signals EQ0 and EQ1 and the transfer signals TG0 and TG1. Now, the explanation is given on a case in which the timing with which the potential of the transfer signal TG1 (=equalize signal EQ0) shifts to the ground potential VSS is delayed to time point t1' from the time point t1 (the time point t1' occurs after time point t2).

At the time point t2, the potentials of the address signal ADD00 and the address signal ADD10 shift to the first source potential VDD, and the potentials of the main word line MWL00 and the address signal ADD010 shift to the ground potential VSS. However, since the potential of the equalize signal EQ (=transfer signal TG1) is still at the second source potential VPP, the address signal A010 output by the OR gate OR00 is holding the second source potential VPP. As a result, the potential at the word line WL00 is at the ground potential VSS.

At the subsequent time point t1', the potential of the equalize signal EQ0 (=transfer signal TG1) shifts to the ground potential VSS. This cuts off the bit line pair BL/BLb from the bit line pair BL1/BL1b which have been connected via the NMOS transistors N10 and N11. In addition, since the NMOS transistors N02, N03 and N04 are turned off, the bit line pair BL0/BL0b is cut off from the third source potential VBL. In addition,with the potential of the address signal A010 output from the OR gate OR00 shifting to the ground potential VSS, the potential at the word line WL00 shifts to the second source potential VPP, causing the electrical charge stored at the cell capacitor C00 to be discharged to the bit line BL0b via the NMOS transistor M00. As a result, the potentials at the bit lines BL0b and BLb rise, creating slight differences in the potential relative to the potential at the bit line BL0 and the bit line BL respectively that still hold the third source potential VBL.

At a time point t3, the potential of the sense amplifier activating signal SENSE shifts to the first source potential VDD. In response, the logic operation unit LB1 provided at the control circuit block cnt103 sets the sense amplifier activating signal SE to the ground potential VSS, and the sense amplifier control circuit unit acnt provided at the sense amplifier block sa biases the sense node SN to the ground potential VSS and biases the sense note SP to the first source potential VDD. Then, with the sense node SN and the sense node SP respectively biased to the ground potential VSS and the first source potential VDD, the NMOS transistors N0 and N1 and the PMOS transistors P0 and P1 provided at the sense amplifier unit amp in the sense amplifier block sa start operation to amplify the slight difference between the potentials at the bit line BLb and the bit line BL. In other words, the bit line BLb is biased to the first source potential VDD and the bit line BL is biased to the ground potential VSS.

Through the operation described above, the electrical charge stored at the cell capacitor C00 is read out at the bit line pair BL/BLb. Then, with the potential at the bit line BLb (the first source potential VDD) transmitted to the cell capacitor C00 via the NMOS transistor M00, the electrical charge at the cell capacitor C00 ("1" information) discharged at the time point t2 is compensated. It is to be noted that in order to compensate the electrical charge at the cell capacitor C00 (charged to achieve the first source potential VDD), it is necessary to set the second source potential VPP higher than, at least, VDD+Vt (the threshold voltage of the NMOS transistor M00).

Starting at a time point t4, an equalize operation is executed. The potentials of the address signals ADD00 and ADD10 shift to the ground potential VSS. Then, the potentials of the main word line MWL00 and the address signal ADD010 shift to the second source potential VPP and the potential of the address signal A010 shifts to the second source potential VPP as well, causing the potential of the word line WL00 to shift to the ground potential VSS. This turns off the NMOS transistor M00 and cuts off the cell capacitor C00 from the bit line BL0b.

At a time point t5, the potential of the sense amplifier activating signal SENSE shifts to the ground potential VSS, and the sense nodes SN and SP and the bit line pair BL/BLb are cut off from the ground potential VSS and the first source potential VDD.

At a time point t6, the potential of the block selection signal BS0 shifts to the ground potential VSS. This causes the potential of the transfer signal TG1 (=equalize signal EQ0) to shift to the second source potential VPP so that the bit line pair BL0/BL0b, the bit line pair BL/BLb and the bit line pair BL1/BL1b become connected via the NMOS transistors N00, N01, N10 and N11.

In addition, the potential of the equalize signal EQ0 (=transfer signal TG1) shifts to the second source potential VPP to turn on the NMOS transistors N02, N03, N04, N12, N13 and N14. As a result, the bit line BL0 and the bit line BL0b become connected to each other and the bit line BL1 and the bit line BL1b become connected to each other, which, in turn, results in the bit line pair BL0/BL0b and the bit line pair BL1/BL1b becoming equalized at the third source potential VBL.

Furthermore, since the potential of the equalize signal EQ shifts to the first source potential VDD, the sense nodes SN and SP are equalized at the third source potential VBL by the sense amplifier control circuit unit acnt provided at the sense amplifier block sa.

Moreover, the bit line pair BL/BLb, which is connected to the bit lines BL0 and BL0b and the bit lines BL1 and BL1b via the NMOS transistors N00, N01, N10 and N11, are equalized at the third source potential VBL.

The equalize operation ends at a point in time at which the potentials at the bit lines BL, BLb, BL0, BL0b, BL1 and BL1b are all set equal to the third source potential VBL with no difference in the potential left among them.

As explained above, in the semiconductor memory device in the fourth embodiment provided with OR gates OR00 and OR01 that respectively drive the address signals A010 and A110, the word lines WL00, WL01, WL02, WL03, WL10, WL11, WL12 and WL13 are driven in conformance to the NOR logic of the potential levels of the address signals A010 and A110 and the potential levels at the main word lines MWL00, MWL01, MWL10 and MWL11. Namely, the individual word lines WL00, WL01, WL02 and WL03 are set in an active state only when the equalize signal EQ0 (=transfer signal TG1) has shifted to the ground potential VSS, and the individual word lines WL10, WL11, WL12 and WL13 are set in an active state only when the equalize signal EQ1 (=transfer signal TG0) has shifted to the ground potential VSS.

For instance, even when the semiconductor memory device in the fourth embodiment is provided with a plurality of sense amplifier blocks and the parasitic capacitance and the parasitic resistance in the lines through which the equalize signals EQ0 and EQ1 (=transfer signals TG1 and TG0) increase as a result to cause a delay in the timing with which the potential levels of the equalize signals EQ0 and EQ1 (=transfer signals TG1 and TG0) shift, the individual word lines WL00, WL01, WL02, WL03, WL10, WL11, WL12 and WL13 do not shift to the second source potential VPP until after the potentials of the equalize signals EQ0 and EQ1 (=transfer signals TG1 and TG0) have shifted to the ground potential VSS. In other words, by the time the potentials at the individual word lines WL00, WL01, WL02, WL03, WL10, WL11, WL12 and WL13 shift to the second source potential VPP, the potentials of the equalize signals EQ0 and EQ1 will have shifted to the ground potential VSS. Consequently, in the semiconductor memory device in the fourth embodiment, the electrical charges discharged from a selected cell capacity does not become discharged to the third source potential VBL via the NMOS transistors N02, N03, N12 and N13 so that any data read error is prevented.

In addition, while the explanation is given in reference to this embodiment on a case in which the timing with which the equalize signals EQ0 and EQ1 (=transfer signals TG1 and TG0) shift to the ground potential VSS is delayed, the semiconductor memory device in the fourth embodiment achieves the following outstanding advantages even when there is no delay. Namely, in the prior semiconductor memory device, while it is necessary to delay the timing with which the potentials of the address signals ADD00, ADD01, ADD10 and ADD11 shift (time point t2) by a specific length of time from the time point t1 in consideration of the delay in the equalize signals EQ0 and EQ1 (=transfer signals TG1 and TG0), the semiconductor memory device in the fourth embodiment does not require any delay in the timing with which the potentials of the address signals ADD00, ADD01, ADD10 and ADD11 shift. Furthermore, the potentials of the address signals ADD00, ADD01, ADD10 and ADD11 can be made to shift at the time point t1, which ultimately achieves high speed access.

(Fifth Embodiment)

Figure 8:
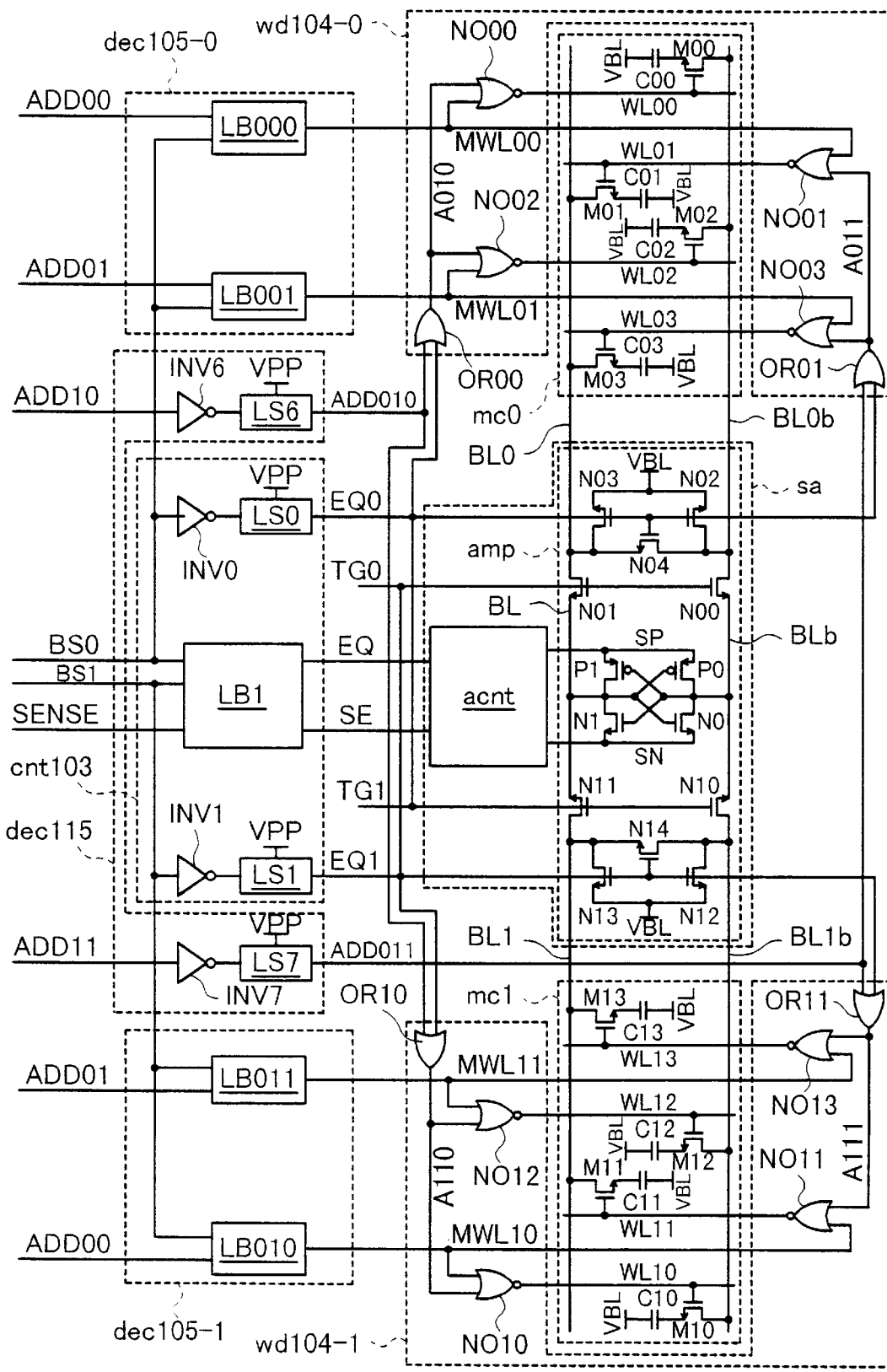
FIG. 8 is a circuit diagram showing the structures of the memory cell peripheral circuits in the semiconductor memory device in a fifth embodiment of the present invention.
Figure 9:
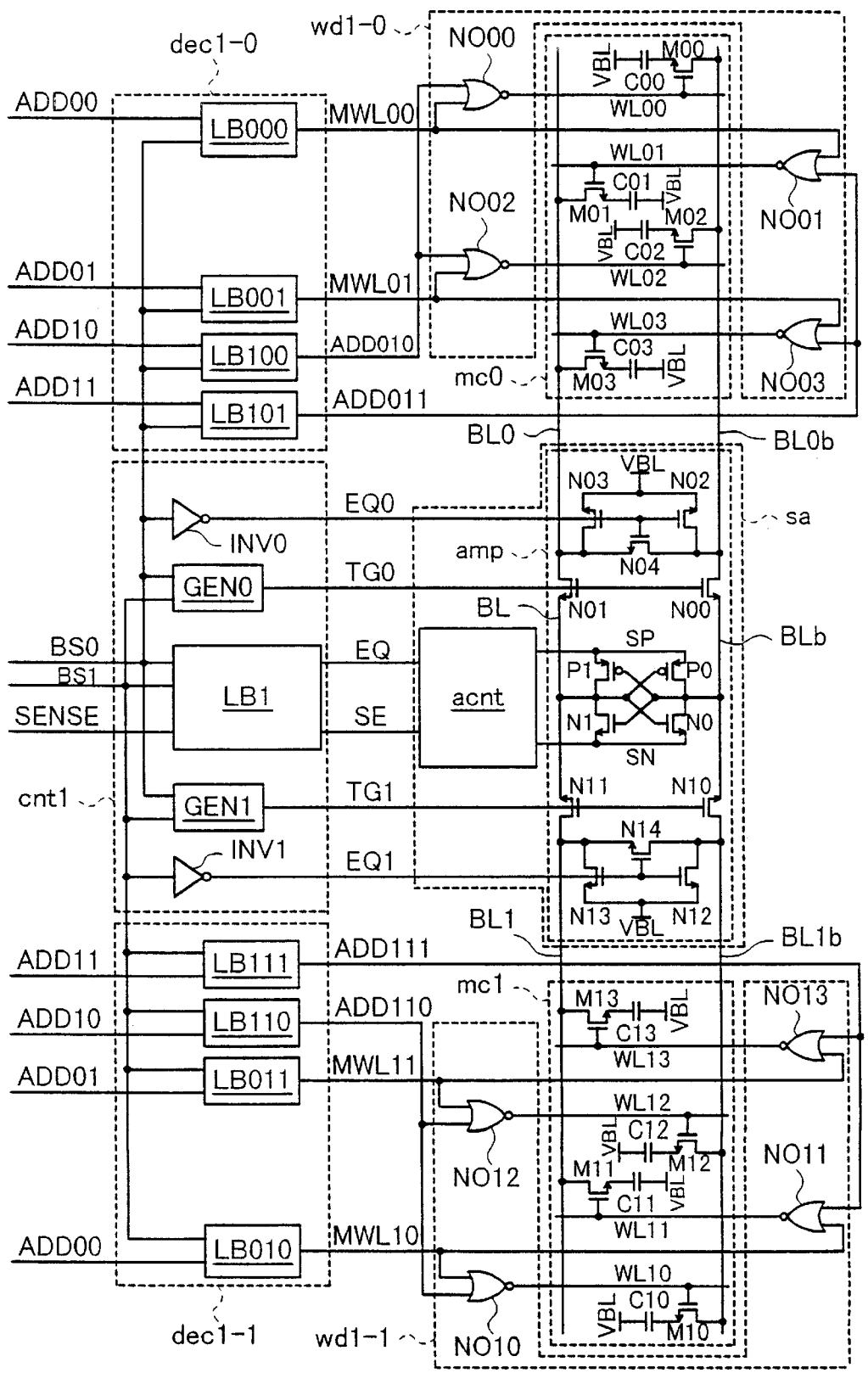
FIG. 9 is a circuit diagram illustrating the structures of the memory cell peripheral circuits in a semiconductor memory device in the prior art.

FIG. 8 illustrates the structures of the memory cell peripheral circuits in the semiconductor memory device in the fifth embodiment of the present invention. This semiconductor memory device includes a sense amplifier block sa, a pair of memory cell blocks mc0 and mc1, a pair of word driver blocks wd104-0 and wd104-1, a pair of decoder blocks dec105-0 and dec105-1, a decoder block dec115 and a control circuit block cnt103. In other words, the semiconductor memory device in the fifth embodiment adopts a structure achieved by replacing the pair of decoder blocks dec1-0 and dec1-1 in the semiconductor memory device in the fourth embodiment with the pair of decoder blocks dec105-0 and dec105-1 and adding another decoder block dec115.

The pair of decoder blocks dec105-0 and dec105-1 are respectively provided in correspondence to the word driver blocks wd104-0 and wd104-1. It is to be noted that since the decoder blocks dec105-0 and dec105-1 have structures that are practically identical to each other, the explanation is given below on the decoder block dec105-0 as an example.

The decoder block dec105-0, to which address signals ADD00 and ADD01 and block selection signals BS0 are input, drives the main word lines MWL00 and MWL01.

The decoder block dec105-0 comprises a logic operation unit LB000 that outputs the results of a logic operation performed in conformance to the address signal ADD00 and the block selection signal BS0 to the main word line MWL00 and a logic operation unit LB001 that outputs the results of a logic operation performed by using the address signal ADD01 and the block selection signal BS0 to the main word line MWL01. In other words, the decoder block dec105-0 assumes a structure achieved by omitting the logic operation units LB100 and LB101 in the decoder block dec1-0.

The decoder block dec115 comprises inverters INV6 and INV7 and level shifters LS6 and LS7. Inverter INV6 inverts the potential level of the address signal ADD10, whereas the inverter INV7 inverts the potential level of an address signal ADD11. In addition, the level shifter LS6 generates an address signal ADD010 whose potential swings back and forth between the second source potential VPP and the ground potential VSS by amplifying the output from the inverter INV6 and the level shifter LS7 generates an address signal ADD011 whose potential swings back and forth between the second source potential VPP and the ground potential VSS by amplifying the output from the inverter INV7.

The address signal ADD010 output by the decoder block dec115 is input to one input end of the OR gate OR00 provided at the word driver block wd104-0, with the equalize signal EQ0 (=transfer signal TG1) input to another input end, and to one input end of the OR gate OR10 provided at the word driver block wd104-1, with the equalize signal EQ1 (=transfer signal TG0) input to another input end.

In addition, the address signal ADD011 output by the decoder block dec115 is input to one input end of an OR gate OR01 provided at the word driver block wd104-0 with the equalize signal EQ0 (=transfer signal TG1) input to another input end, and to one input end of an OR gate OR11 provided at the word driver block wd104-1, with the equalize signal EQ1 (=transfer signal TG0) input to another input end.

Since the equalize signals EQ0 and EQ1 (=transfer signals TG1 and TG0) whose potentials swing back and forth between the second source potential VPP and the ground potential VSS in correspondence to the potential levels of the block selection signals BS0 and BS1 are input to the other input ends of the OR gates OR00, OR01, OR10 and OR11, the address signals ADD10 and ADD11 are respectively converted to the address signals ADD010 and ADD011 without requiring any logic operation to be performed for themselves and the block selection signals BS0 and BS1, and are input to the input ends of the OR gates OR00, OR01, OR10 and OR11 on one side. In other words, in the semiconductor memory device in the fifth embodiment, the address signals ADD010 and ADD011 can be shared by the word driver blocks wd104-0 and wd104-1 so that advantages similar to those achieved by the semiconductor memory device in the fourth embodiment are achieved while achieving a reduction in the layout area in the semiconductor memory device.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

As has been explained, the semiconductor memory device according to the present invention realizes high speed access in a simple circuit structure even while achieving energy efficiency and a larger capacity.

The entire disclosure of Japanese Patent Application No. 11-107737 filed on Apr. 15, 1999 including specification, claims, drawings and summary is incorporated herein by reference in its entirety.

What is claimed is:

1. A semiconductor memory device, comprising:
   a first memory element group including one or more memory elements that store information;
   a second memory element group including one or more memory elements that store information;
   a first bit line pair, including a first one bit line and a first other bit line, through which information read out from the one or more memory elements in said first memory element group is transmitted;
   a second bit line pair, including a second one bit line and a second other bit line, through which information read out from the one or more memory elements in said second memory element group is transmitted;
   a means for amplification that
      amplifies potentials the first one bit line and the first other bit line to a reference potential and a first source potential respectively, and
      amplifies potentials at the second one bit line and the second other bit line to the reference potential and the first source potential respectively;
   a first amplification means connector transistor connecting the first one bit line to said means for amplification;
   a second amplification means connector transistor connecting the first other bit line to said means for amplification;

a third amplification means connector transistor connecting the second one bit line to said means for amplification;

a fourth amplification means connector transistor connecting the second other bit line to said means for amplification;

a first means for equalization that is controlled by a first control signal achieving a second source potential higher than the first source potential and equalizes the first bit line pair to a third source potential, the first control signal further controlling the third amplification means connector transistor and the fourth amplification means connector transistor; and a second means for equalization that is controlled by a second control signal achieving the second source potential and equalizes the second bit line pair to the third source potential, the second control signal further controlling the first amplification means connector transistor and the second amplification means connector transistor.

2. A semiconductor memory device according to claim 1, further provided with:

a first level shifter that shifts the level of a first input signal at said first source potential to said second source potential and outputs the resulting signal as said first control signal; and a second level shifter that shift the level of a second input signal at said first source potential to said second source potential and outputs the resulting signal as said second control signal.

3. A semiconductor memory device according to claim 1, further provided with:

a plurality of first word lines each connected to one of said memory elements in said first memory element group;

a first means for word line drive that selectively drives one of said plurality of first word lines in correspondence to the potential level of said first control signal;

a plurality of second word lines each connected to one of said memory elements in said second memory element group; and a second means for word line drive that selectively drives one of said plurality of second word lines in correspondence to the potential level of said second control signal.

4. A semiconductor memory device according to claim 3, wherein:

said first means for word line drive is provided with;

a plurality of first word line drive units that individually drive said plurality of first word lines; and a first selection unit that selects one of said plurality of first word line drive units in correspondence to said potential level of said first control signal and the potential level of an address signal; and said second means for word line drive that is provided with;

a plurality of second word line drive units that individually drive said plurality of said second word lines in correspondence to said potential level of said second control signal;

a second selection unit that selects one of said plurality of second word line drive units in correspondence to said potential level of said second control signal and the potential level of said address signal.

5. A semiconductor memory device according to claim 4, wherein:

said first word line drive units include a plurality of logic gates, the number of which corresponds to the number of said plurality of first word lines; and said second word line drive units include a plurality of logic gates, the number of which corresponds to the number of said plurality of second word lines.

* * * * *